United States Patent [19]
Juliusburger et al.

[11] 4,057,768
[45] Nov. 8, 1977

[54] VARIABLE INCREMENT PHASE LOCKED LOOP CIRCUIT

[75] Inventors: Hans Yohanan Juliusburger, Putnam Valley; Donald Wortzman, Carmel, both of N.Y.

[73] Assignee: International Business Machines Corporation, Armonk, N.Y.

[21] Appl. No.: 740,700

[22] Filed: Nov. 11, 1976

[51] Int. Cl.² ............................................. H03B 3/00
[52] U.S. Cl. ...................................... 331/1 A; 331/16
[58] Field of Search ......................... 331/1 A, 14, 16; 328/134; 307/271, 295

[56] References Cited

U.S. PATENT DOCUMENTS

| | | | |
|---|---|---|---|
| 3,651,422 | 3/1972 | Underhill | 331/1 A |
| 3,689,849 | 9/1972 | Swanson et al. | 331/1 A |
| 3,840,821 | 10/1974 | Conway | 331/1 A |
| 3,872,397 | 3/1975 | Hanneman | 331/1 A |
| 3,882,412 | 5/1975 | Apple, Jr. | 331/1 A |
| 3,883,817 | 5/1975 | Cliff | 331/1 A |
| 3,913,028 | 10/1975 | Bosselaers | 331/1 A |
| 3,928,813 | 12/1975 | Kingsford-Smith | 331/1 A |
| 3,931,585 | 1/1976 | Barker et al. | 331/1 A |
| 3,956,710 | 5/1976 | Seitz et al. | 331/1 A |
| 4,001,713 | 1/1977 | Egan | 331/1 A |

*Primary Examiner*—John Kominski
*Attorney, Agent, or Firm*—James M. Thomson

[57] ABSTRACT

A variable increment phase locked loop circuit designed for use in a digital data communications system wherein a data input signal is synchronized with a local feedback signal by means of comparing the data input signal and the local feedback signal, and providing frequency adjustments to the feedback signal that are proportional to the instantaneous deviation between the data input signal and the feedback signal. In one embodiment, the circuit is not responsive to deviations between the data input signal and the feedback signal that are less than a preset threshold value. The output of the circuit is useful as a stabilized system clock signal.

7 Claims, 7 Drawing Figures

VARIABLE INCREMENT PHASE LOCKED LOOP CIRCUIT

BACKGROUND OF THE INVENTION

The present invention relates to a phase locked loop circuit adapted for use in high speed communication systems. More particularly, the invention concerns a digital phase locked loop circuit especially adapted for synchronizing the frequency of a remote data input signal and an internal feedback signal to provide a reliable reference clock output signal.

Phase locked loop circuits are well known in the prior art, for the purpose of providing data output signals that are continually synchronized with a clock signal. Usually phase locked loop circuits accomplish frequency and phase synchronization by means of comparing the input data signal with a feedback signal and then eliminating the difference in frequency and phase between the two signals by means of incremental adjustments to one of the signals until the comparator records a null output. One such system is described in U.S. Pat. No. 3,777,272, for example.

The above mentioned systems are satisfactory for many purposes. However, such systems have a major shortcoming in that phase adjustment is accomplished in fixed increments by adding or deleting one pulse at a time from the signal to be corrected until a synchronized output condition is reached. Obviously, the addition of one pulse at a time to a signal requires a longer synchronization time than a system wherein the adjustment is provided in multiple pulse steps. Moreover, the systems of the prior art do not always provide satisfactory synchronization when the incoming data signal exhibits transient conditions in addition to steady state phase jitter.

Accordingly, a need exists for a digital phase locked loop circuit which is able to maintain synchronization between an input data signal and a local clock or feedback signal during conditions of both phase jitter and transient interference.

SUMMARY OF THE INVENTION

The present invention provides an improved digital phase locked loop circuit which is especially adapted for use in high speed communication systems wherein a data input signal is maintained in synchronization with an internal clock or feedback signal by means of comparing the two signals and providing a frequency adjustment to the feedback signal that is proportional to the instantaneous deviation between the data input signal and the feedback signal. To achieve synchronizaton, groups of pulses are added to or deleted from the feedback signal to quickly restore synchronization between the two signals. In an alternate embodiment of the invention, the system can be manually adjusted whereby it is unresponsive to phase differences between the incoming data signal and the feedback signal that are less than a preset threshold value.

BRIEF DESCRIPTION OF THE DRAWINGS

Other features and advantages of the invention will become apparent from the following detailed description of the invention taken in conjunction with the accompanying drawings wherein.

DETAILED DESCRIPTION OF THE INVENTION

Figure 1:
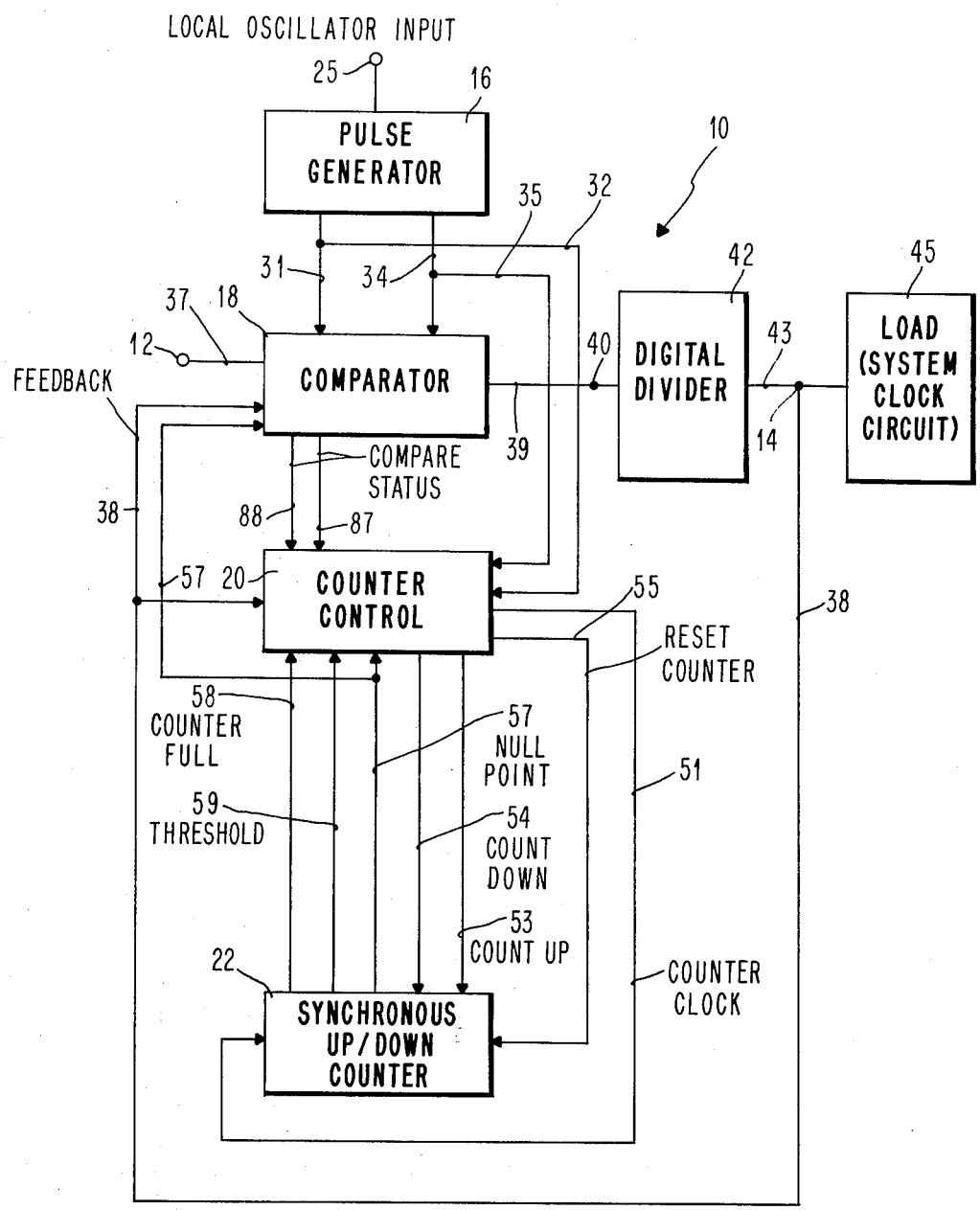
FIG. 1 is a block diagram of one preferred embodiment of the invention.

Referring now to the drawings and particularly to FIG. 1 the preferred embodiment of the invention is illustrated comprising a phase locked loop circuit 10 adapted for use in a high speed communications system, for example. Circuit 10 is adapted to synchronize a remote data input signal received at data input terminal 12 and provide a synchronized output signal on terminal 14 which is connected to a load such as a systems clock 45 of a communications adapter, for example. The circuit includes a pulse generator 16, a comparator 18, a counter control 20, a digital divider 42 and a synchronous up down counter 22. External clock input is provided from a local oscillator, not illustrated, to an input terminal 25 of the pulse generator.

Pulse generator 16 is of conventional design and is adapted to provide a digital clock pulse signal to comparator 18 and counter control 20, via conductors 31, 32 respectively. The pulse generator also provides a second digital clock pulse signal to comparator 18 and counter 20 via conductors 34, 35 which is of identical frequency and is 180° out of phase with respect to the clock output signal provided on conductors 31, 32. The clock pulses on conductors 31, 32 are referred to hereinafter as A pulses and the out of phase pulses as B pulses.

Comparator 18 receives the data input signal as one input from terminal 12 via conductor 37. It also receives another input via conductor 38 which comprises a Feedback signal from terminal 14. The output of comparator 18 is connected via conductor 39 to an input terminal 40 of a conventional digital divider circuit 42, with the output of divider 42 being connected to terminal 14 by a conductor 43. Divider 42 reduces the frequency of the digital signal on conductor 39 by a factor of 10 or more to provide a desired output frequency for the system clock comprising load circuit 45, for example.

Comparator 18 also receives a Null Point signal from counter 20 via conductor 37 and provides Compare Status signals to counter control 20 via conductors 87, 88. Counter control 20 also receives the Feedback signal from terminal 14 via conductor 38.

Various other signals are exchanged between counter control 20 and counter 22. In particular, counter control 20 provides a Counter Clock signal as an input to counter 22 via conductor 51. Moreover, counter control 20 provides Count Up and Count Down signals to the counter via conductors 53, 54; and a Reset Counter signal to the counter via a conductor 55. In addition, the counter control circuit receives Null Point signals from the counter via conductor 57 and a Counter Full signal from the counter via conductor 58. Finally, counter control 20 receives a Threshold signal from the counter via the conductor 59.

Figure 2:
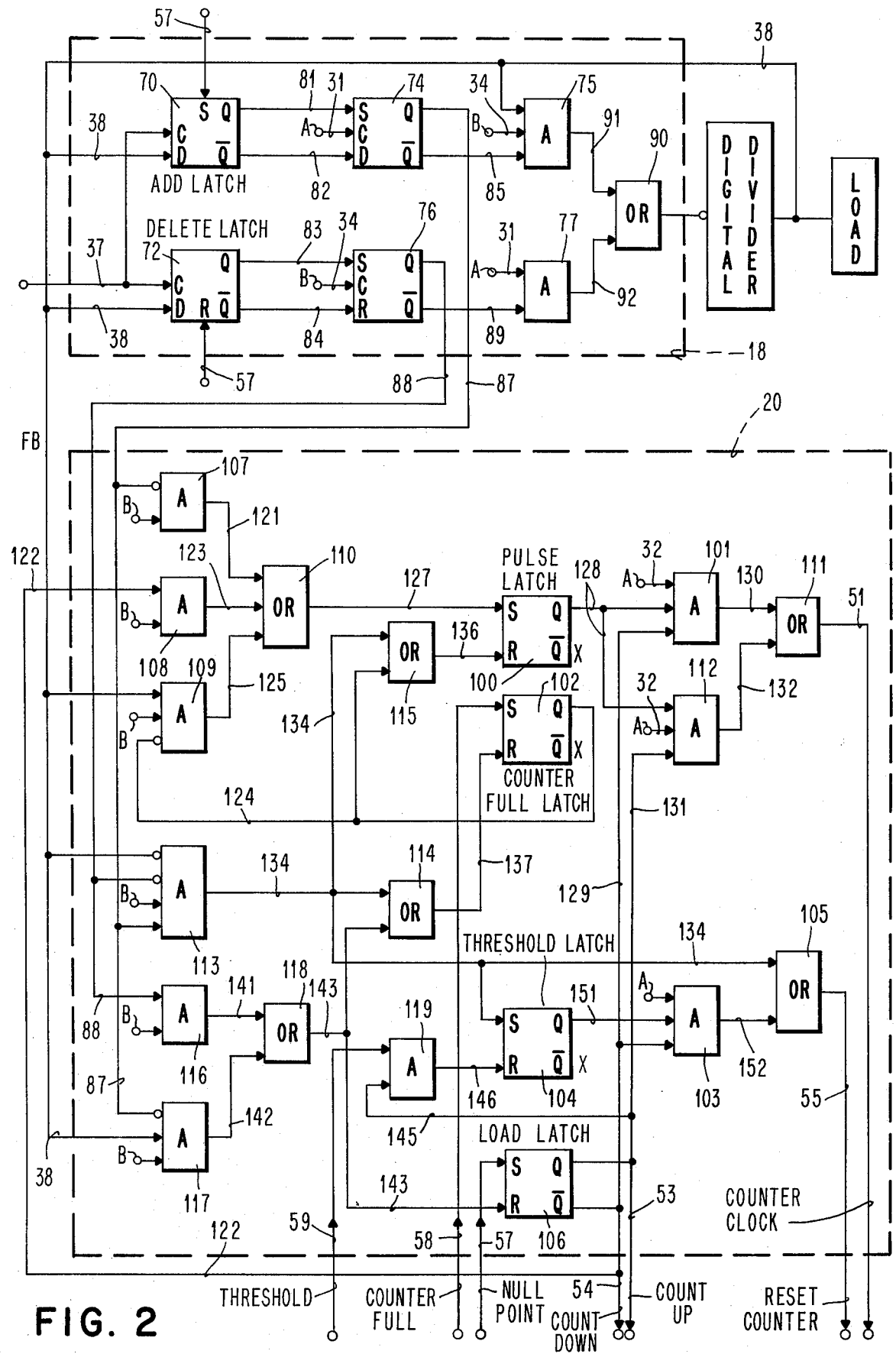
FIG. 2 is an electrical schematic diagram of the comparator circuit and the counter control circuit illustrated in FIG. 1.

Referring now to FIG. 2, the circuitry of comparator 18 and counter control 20 is illustrated in detail. Referring particularly to the upper part of the figure, comparator 18 includes the circuitry illustrated within the dotted outline comprising an add latch 70 and a Delete latch 72. A latch 74 and an AND gate 75 are associated with latch 70; and in similar fashion a latch 76 and an AND gate 77 are associated with latch 72.

Latches 70, 72 each include a data input terminal connected to conductor 38 whereby each latch receives Feedback signals. In addition each of the latches includes a clock input adapted to receive Remote Data Input signals via conductor 37. One input terminal of AND gate 75 also receives the Feedback signal as an input via conductor 38. Latch 70 includes a Q output and a $\overline{Q}$ output which are connected to set and reset inputs of latch 74 by conductors 81, 82 respectively. In similar fashion, the Q and $\overline{Q}$ outputs of latch 72 are connected to set and reset inputs of latch 76 by conductors 83, 84 respectively.

Latch 70 includes a set terminal connected to receive Null Point signals from counter 22 via conductor 57 and latch 72 includes a reset terminal also adapted to receive Null Point signals from the counter via conductor 57. Latch 74 further includes a clock input which is adapted to receive A pulses from pulse generator 16 via conductor 31 and includes a $\overline{Q}$ output terminal connected to an input terminal of AND gate 75 by a conductor 85. The Q output of latch 74 is connected to internal circuitry of the counter control to provide Compare Status signals thereto via a conductor 87. AND gate 75 receives B pulses at a third input terminal via conductor 34, and provides an output signal to OR gate 90 via a conductor 91. In similar fashion, the $\overline{Q}$ output of latch 76 is connected to an input terminal of AND gate 77 by a conductor 89 and the Q output of latch 76 is connected to provide Compare Status signals to counter control 20 via a conductor 88. Latch 76 otherwise receives B pulses at a clock input terminal via conductor 34. The circuitry of comparator 18 is completed by conductor 31 supplying A pulses as an input to gate 77 and a conductor 92 interconnecting the output of AND gate 77 to an input of OR gate 90.

It should be understood that latches 70, 72 are conventional edge triggered latches. Latch 70 is normally set by the Null Point signal whereby its Q output is high and latch 72 is normally reset by the Null Point signal whereby its $\overline{Q}$ latch is normally high. If either latch 70 or latch 72 subsequently receives a clock input signal via conductor 37 the output of the latch is then set to follow the state of the Feedback signal or conductor 38 that exists upon occurrence of the leading edge of the clock signal. Thus, if latch 70 is clocked with the Feedback signal down, the $\overline{Q}$ output will be up and the Q output will be down. When the latch is clocked with the Feedback signal up, the opposite will be true. Latch 72 will behave in an identical fashion.

Latches 74, 76 are also conventional edge triggered latches and each will change state only when clocked. Thus, latch 74 will assume a high Q output when the set signal is high and a high $\overline{Q}$ output when the reset signal is high.

Referring now to the bottom portion of FIG. 2, counter control 20 is illustrated as specifically including a Pulse latch 100, a Counter Full latch 102, a Threshold latch 104 and a Load latch 106. Each of these latches is a conventional latch that includes set and reset inputs and Q and $\overline{Q}$ outputs. The Q output of each is high when the set input is high and the $\overline{Q}$ output is high when the reset input is high.

Counter control 20 otherwise includes AND gates 107, 108 and 109. Each of these AND gates has one input which is connected to receive B pulses via conductor 35. AND gate 107 also receives an inverted Compare Status signal on its other input from conductor 87 and has an output that is connected via a conductor 121 to an input of OR gate 110. The other input of AND gate 108 receives a Count Down signal from the $\overline{Q}$ output of latch 106 via a conductor 122 and has an output that is connected to a second input of gate 110 via conductor 123. Gate 109 has a second input that is connected to receive the Feedback signal via conductor 38 and a third, inverted input that is connected to the Q output of latch 102 via conductor 124. The output of gate 109 is connected to the third input of gate 110 via a conductor 125.

The output of gate 110 is connected to the set input of latch 100 by conductor 127. The Q output of latch 100 is connected via a conductor 128 to inputs of AND gate 101 and AND gate 112, respectively. AND gate 101 also receives A pulse signals at a second input via conductor 32. The third input of gate 101 receives Count Down signals from the $\overline{Q}$ output of latch 106 via a conductor 129. The output of gate 101 is connected to an input of OR gate 111 by a conductor 130. As shown the output of gate 111 comprises the Counter Clock signal communicated to the counter by conductor 51. Gate 112 receives A pulses at a second input via conductor 32 and receives Count Up signals from the Q output of load latch 106 via a conductor 131. The A pulses feeding gate 112 can be identical to the A pulses derived from conductor 32 or they could be obtained from a circuit, not shown, which passes A pulses through one or more divider circuit stages. The output of gate 112 is connected to an input of OR gate 111 by a conductor 132.

Referring again to the left side of the counter control an AND gate 113 is provided, adapted to receive inverted Feedback signals at one input via conductor 38, and B pulse signals at another input via conductor 35. Gate 113 also includes an inverted input adapted to receive signals from the Q output of latch 76 via conductor 88 and a fourth input adapted to receive signals from the Q output of latch 74 via conductor 87. The output of gate 113 is connected to an input of OR gate 114 and an input of OR gate 115, respectively, by conductor 134. The output of AND gate 113 is also connected to the set input of Threshold latch 104 by conductor 134. A second input of OR gate 115 is connected to the Q output of latch 102 by conductor 124. The output of gate 115 is connected to the reset terminal of 100 by a conductor 136. The output of OR gate 114 is connected to the reset terminal of latch 102 via a conductor 137.

Referring again to the left of counter control 20, AND gates 116, 117 are provided each having an input terminal adapted to receive B pulses via conductor 35. A second input of gate 116 is adapted to receive signals from the Q output of gate 76 via conductor 88 and an inverted input terminal of gate 117 is adapted to receive input signals from the Q output of latch 74 via conductor 87. Gate 117 is also adapted to receive, on a third input terminal, Feedback signals via conductor 38.

The outputs of gates 116, 117 are connected to input terminals of an OR gate 118 via conductors 141, 142 respectively. The output of OR gate 118 is connected to an input terminal of OR gate 114 via a conductor 143. In similar fashion, the output of gate 118 is connected to the reset input of latch 106, also by conductor 143. As shown, the Counter Full signal from counter 22 is provided to the set terminal of latch 102 via conductor 58; the Threshold signal from the counter is provided to an input of an AND gate 119 via conductor 59; and the Null Point signal from the counter is provided to the set terminal of latch 106 via conductor 57. AND gate 119 receives a second input signal from the Q output of latch 106 via a conductor 145. The output of gate 119 is connected to the reset input of latch 104 via a conductor 146.

As shown the Q output of latch 106 comprises the Count Up signal to the counter and is connected thereto via conductor 53; and the $\overline{Q}$ output of latch 106 comprises the Count Down signal to the counter and is connected thereto via conductor 54. The Q output of threshold latch 104 is connected to one input terminal of an AND gate 103 via a conductor 151. Gate 103 also receives A pulses on another input via conductor 32 and receives Count Down signals on its third input via conductor 129 from the $\overline{Q}$ terminal of latch 106. The output of gate 103 is connected to an input terminal of an OR gate 105 via a conductor 152. The other input terminal of gate 105 receives a signal from the output of AND gate 113 via conductor 134. The output of gate 105 comprises the Reset Counter signal and is connected to the counter via conductor 55, as shown.

Figure 3:
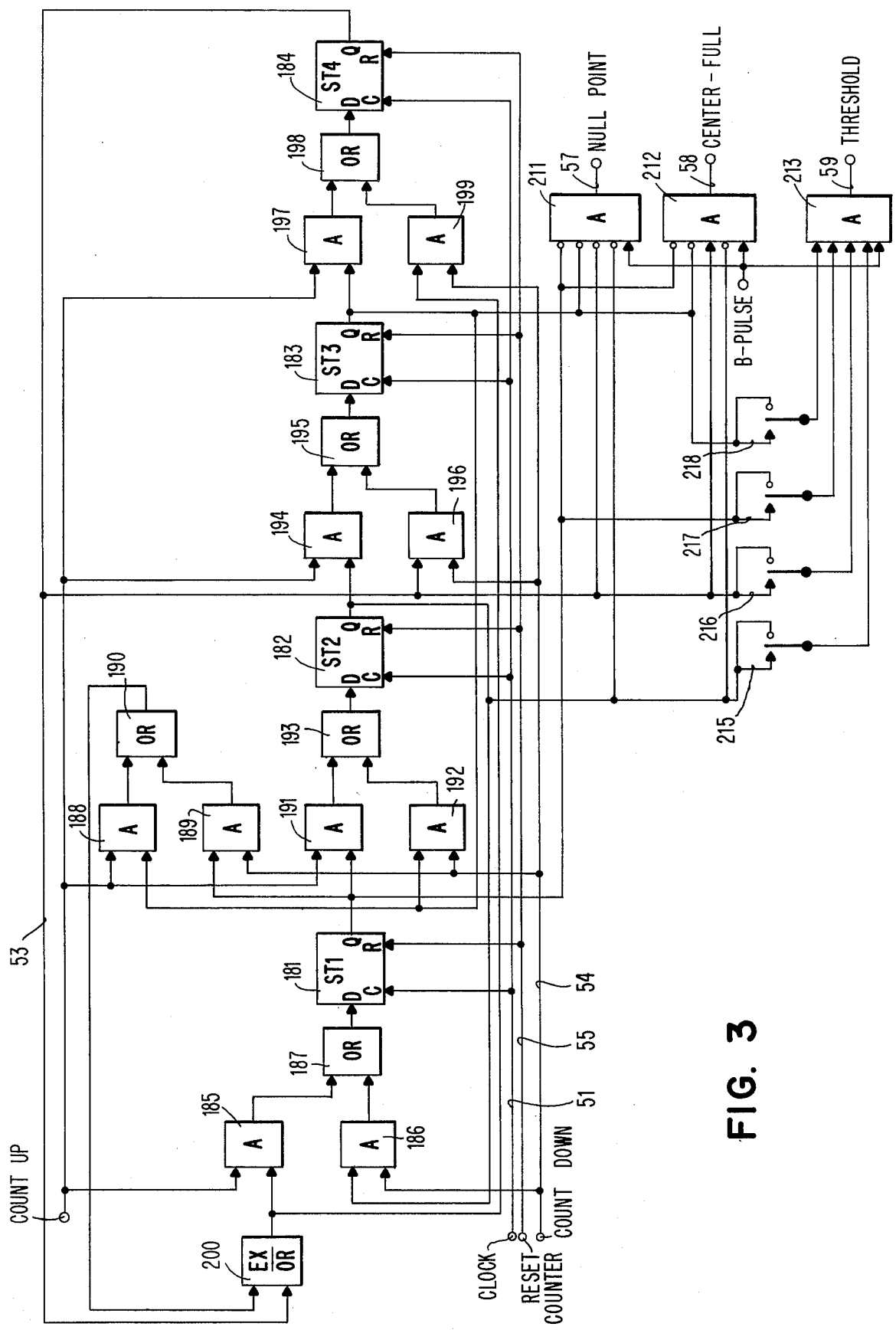
FIG. 3 is an electrical schematic diagram of the synchronous counter illustrated in FIG. 1.

Referring now to FIG. 3, a specific schematic diagram of the counter 22 is illustrated. Counter 22 is a synchronous up down counter of conventional design including four counting or shift register stages designated 181, 182, 183 and 184. Each stage exhibits either a high or a low state. If the input to a particular stage is high then the stage will become high at the next Counter Clock pulse, and remain so until the next Counter Clock pulse. The opposite is true for stages with low inputs.

The stages are interconnected by logic circuitry as shown and by exclusive OR circuit 200. Circuit 200 exhibits a high output if both its inputs are equal, and a low output if its inputs are unequal. The Reset Counter signal from counter control 20 is transmitted to a reset terminal of each stage by conductor 55. This sets each stage in the counter to a 0 or low condition. Count Up signals subsequently received by the counter via conductor 53 are then distributed to the stages via logic as shown and set the counter for count up condition whereby subsequent Counter Clock signals received from the counter control circuit will cause the counter to count up in a conventional sequence. Subsequent receipt of a Count Down signal from the counter control via conductor 54 will be applied through the logic circuitry shown to the respective stages whereby the counter is set for reverse or Count Down operation. Subsequent counter clock signals reaching the counter will then cause the counter to count backwards or down.

AND gate 211 is interconnected in a fashion illustrated to each of the counter stages whereby the gate, when satisfied by each of its five inputs produces the Null Point signal whenever the counter reaches a 0 count state, for example, when it has counted forward and then counted backward by the same number of counts.

The Counter Full gate 212 likewise produces an output signal when the conditions of its five input signals have all been satisfied, i.e., when the counter reaches its maximum count. Threshold gate 213 likewise has five inputs and when they are satisfied it produces an output signal which is supplied back to the counter control via conductor 59. The Threshold signal acts to reset the threshold latch after a given number of counts have been executed by the counter whereby the circuitry of the counter control proceeds with synchronization of the Data Input signal and the Feedback signal in a fashion described hereinafter. Switches 215, 216, 217 and 218 are manual switches within the counter which can be set to either direct or inverted input positions whereby the count at which the Threshold signal is produced by the counter can be manually selected.

Figure 4A:
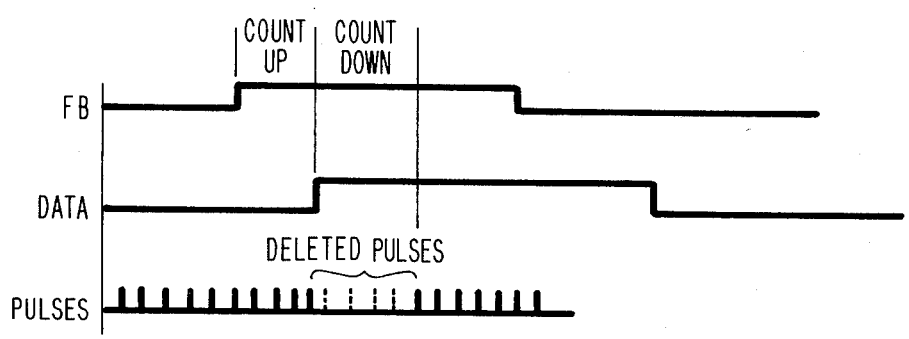
FIGS. 4A and 4B are waveforms illustrating various circuit conditions that occur in the circuits of FIGS. 1-3 during correction of leading and lagging signals respectively.
Figure 5A:
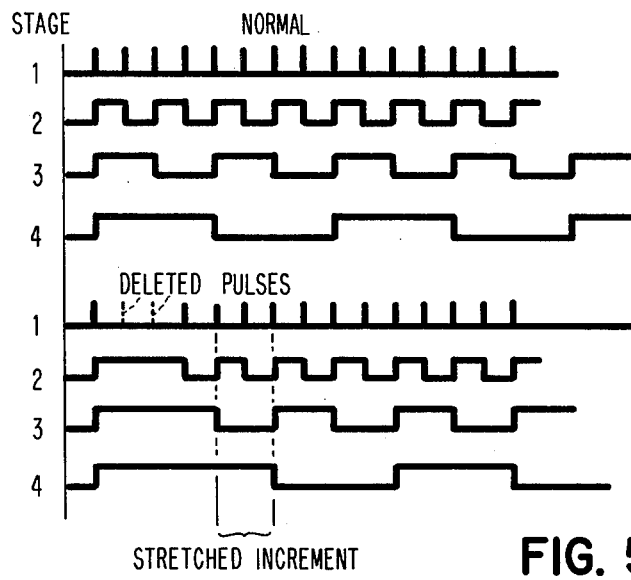
FIGS. 5A and 5B are waveform diagrams that illustrate the stretching and compression of feedback signal pulses that occur, respectively, upon correction for leading and lagging conditions in the circuit of FIGS. 1-3.

The operation of the circuit will be explained in terms of a condition where the Feedback signal occurs in advance of the Data Input signal, i.e., a feedback leading condition as illustrated in FIGS. 4A and 5A. The correction to be effected consists of comparing the two signals, measuring the instantaneous deviation between them and deleting a number of pulses from the comparator output signal to, in effect, stretch the tail of a Feedback pulse until it positionally corresponds to the tail of the corresponding Data Input pulse. It should be recognized that an effective adjustment may require several cycles of operation of the circuit depending upon the degree of difference between the two signals. However, the correction is more rapid and effective than that heretofore possible by use of addition or deletion of one pulse at a time.

Referring particularly to FIG. 2, in the initial state, Add latch 70 of the comparator circuit is set and Delete latch 72 is reset by the Null Point signal from the counter (since the counter is initially in a 0 counting state). As a consequence, conductors 81, 87, 84 and 89 are up and conductors 82, 85, 83 and 88 are in a down state. Since line 89 is up, AND gate 77 is enabled and the comparator output is a replica of the A pulse signal. Thus, the comparator output is a high frequency pulse train which after passing through a digital divider generates a local system clock which is adpated for use in a communications adapter or other device. The divided signal comprises the Feedback signal, returned to the comparator and counter control via conductor 38. When the Feedback pulse goes up at the occurrence of the leading edge of an A pulse then, in the absence of a Data Input pulse, the counter should start counting to measure the difference between the Feedback pulse position and the Data Input pulse position expected to occur sometime later. The following explanation makes clear how this is accomplished.

The Counter Full latch is reset in its initial state and consequently conductor 124 is down and gate 109 is enabled. In the presence of a Feedback signal, Gate 109 passes B pulses via gate 110 and conductor 127 to the set terminal of pulse latch 100, thereby setting it.

Since load latch 106 was initially in a set state in response to the Null Point signal, gate 112 is enabled, A pulses are transferred through OR gate 111 and supplied to the counter in the form of Counter Clock signals. Consequently, the counter is stepped until a Data Input pulse is received or until the counter has reached its maximum count. If no Data Input signal arrives while the Feedback signal is still in the up state, the counter will continue to up count until it has reached its maximum count. At this time the counter returns a signal to the Counter Full latch 102 via conductor 58. This sets the full latch whereby line 124 is up, thereby disabling AND gate 109, resetting the pulse latch and stopping the stepping of the counter.

With the Feedback signal in an up state, the subsequent occurrence of a Data Input signal on conductor 37 causes Delete latch 72 to change state upon clocking of the latch; whereas add latch 70 will not change state upon clocking. Consequently, conductor 83 goes to an up state and conductor 84 goes to a down state. Upon occurrence of the next B pulse from pulse generator 16, latch 76 is clocked and set. Consequently, conductor 88 goes up and conductor 89 goes down. This disables AND gate 77 and suppresses pulses on the comparator ouput. It should be apparent that, as long as the comparator remains in this state, pulses are deleted from the comparator output signal and this has the effect of stretching the feedback pulse by an amount equal to the number of A pulses deleted from the comparator output. This can be seen best by referring to FIG. 5A wherein the waveforms illustrate the signals present in various stages of the digital divider. It can be seen at after four or more stages of division, the feedback pulse is stretched by an amount which is proportional to the number of A pulses deleted from the comparator output.

Continuing on, the change in condition of conductor 88 to a high state also acts to enable AND gate 116 in the counter control circuit whereby B pulses occur on conductor 143, thereby resetting load latch 106. Resetting of the load latch disables AND gate 112 and enables AND gate 101. With AND gate 101 enabled the Counter Clock signal continues, being comprised of the A pulse train, just as before. However, resetting of the load latch 106 supplies a Count Down signal to the counter and the counter now counts down rather than up.

When the counter has counted back to 0 it sends at least one Null Point signal to the comparator and counter control which causes resetting Add latch 70, Delete latch 72 and load latch 106. The resetting of Delete latch 72 serves to reset latch 76 at the next B pulse and disables AND gate 116.

When the Feedback signal subsequently goes down, with or without a Data Input pulse having been received, the device is recycled by enabled AND gate 113 (since in all cases at this time conductor 87 is up and conductor 88 is down). By enabling gate 113, B pulses are transferred to conductor 134, the pulse latch is reset via OR gate 115, the Counter Full latch is reset via OR gate 114 and the counter is reset via the Reset Counter signal conducted through OR gate 105 to recycle the counter to the 0 state. The 0 state in turn, raises the condition of Null Point which sets the load latch, Add latch and Delete latch to their initial states of operation again.

It should be apparent that in the presence of a Feedback signal and the absence of a Data Input signal the counter will complete a Counter Full cycle and then the operation of the circuit will proceed as described above to reset the operational circuit to its initial states for sensing of the next Feedback pulse.

Figure 4B:
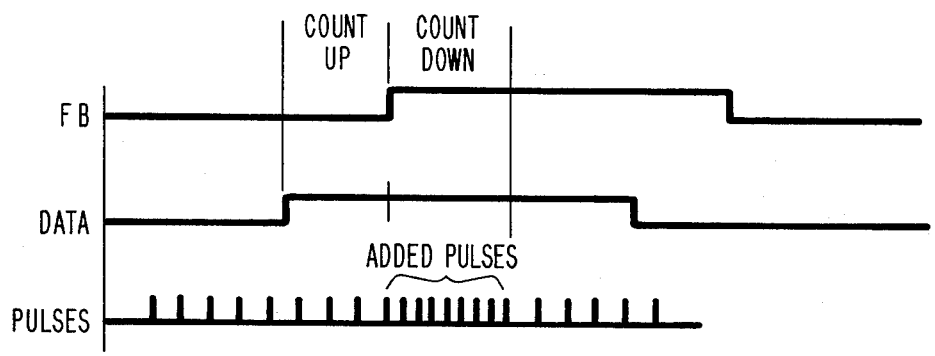
Figure 5B:
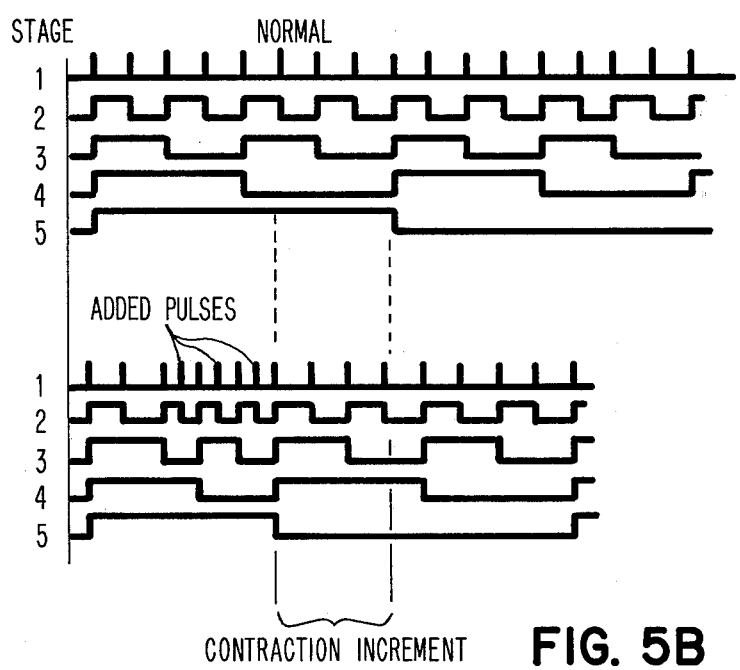

With reference to FIGS. 4B and 5B, the operational circuit with the Data Input signal leading the Feedback signal should be more easily understood. With the Feedback signal in a down state, the occurrence of a Data Input signal changes the state of Add latch 70 without affecting the state of Delete latch 72. Consequently, the next data pulse resets latch 74 such that conductors 85 and 89 are up and conductors 87 and 88 are down.

With conductor 87 down, AND gate 107 is enabled and the next B pulse is transmitted through OR gate 110 via conductor 127 to set pulse latch 100 thereby enabling AND gate 112 and starting a Count Up cycle of the counter in the manner previously described.

When the Feedback signal goes up it causes resetting of the load latch via AND gate 117 which is enabled by the down signal on line 87 and the next occurring B pulse. With the load latch down a Count Down signal is sent to the counter and subsequent operation of the circuit in a manner described hereinbefore results with Counter Clock signals being supplied to the counter via AND gate 101 and OR gate 111. In addition, while the counter is counting down, AND gate 75 is enabled by the Feedback pulse whereby B pulses are imposed upon the comparator output along with the A pulses. The two pulse trains are merged in the comparator output. This has the effect of injecting B pulses into the pulse train and modifying the waveform of the feedback signal in the manner illustrated in FIG. 5B. Thus, it can be seen that the addition of B pulses to the A pulse stream has the effect of shortening the tail of the Feedback pulse until it corresponds with the tail of the Data Input pulse.

When the counter has reached its 0 value, a Null Point signal is transmitted which sets load latch 106, resets Delete latch 72 and sets Add latch 70 in the manner described hereinbefore,. The next A pulse then resets latch 74. The A pulse train is then restored to the comparator output with the B pulse train being cut off and the circuit resumes its normal operation.

The operation of the circuit is altered when the Threshold latch is considered so that the addition and deletion of pulses is effected only when the number of Counter Clock pulses occuring after the Feedback or Data Input pulse arrives is above a certain threshold value. The Threshold latch is set via gate 113 when the device is recycled at the time the Feedback pulse goes down. With the Feedback pulse leading, prior to the Data signal coming up, if the number of Counter Clock pulses occurring after the feedback signal goes up exceeds the threshold value, as manually described by the setting of switches within the counter circuit, the Threshold signal will be received from the counter via AND gate 119 resetting threshold latch 104. Operation can then occur in the normal fashion described hereinbefore in connection with feedback leading operation. However, if the threshold latch is not reset by the time the Data Input pulse arrives, i.e., as will occur when the instantaneous difference between the feedback pulse and the data pulse is below the threshold value, the first A pulse of the Count Down cycle will enable AND gate 103 and provide a Reset Counter signal via OR gate 105 to the counter. This causes the counter to be reset which, in turn, terminates the operation of the cycle and returns the circuit to its stable state after only a single corresponding pulse increment has occurred.

It should be understood that the circuit described hereinbefore has advantages in that it permits immediate total or proportional correction of deviations between the Data Input signal and the Feedback signal, whereas prior art systems utilize a step by step correction by the addition or deletion of one pulse at a time.

Moreover, the circuit enables a threshold type operation to be established whereby any variance or instability which results in a small phase advance or delay between the Feedback and the Data Input signals prevents corrective circuit operation beyond the amount corresponding to one pulse width. This means that the present circuit is less susceptible to fluctuation under conditions of ordinary phase jitter while still being able to respond immediately to large deviations caused by transient signals.

While the invention has been particularly shown and described with reference to the preferred embodiment thereof, it will be understood by those skilled in the art that various changes in form and details may be made therein without departing from the spirit and scope of the invention.

We claim:

1. A digital phase locked loop circuit for synchronizing the phase and frequency of a digital local feedback signal with a digital data input signal comprising
    means for comparing the feedback signal and the data input signal during a predetermined sequence and measuring a number of pulses which represents the instantaneous phase deviation between said signals, and
    means responsive to an output of said comparator means for effecting phase adjustments of the feedback signals by adding to or deleting groups of pulses from the comparator output signal during each said sequence that are proportional to the instantaneous phase deviation between the feedback signal and the data input signal.

2. The digital phase locked loop circuit of claim 1 further including adjustable threshold circuit means for disabling said phase adjusting means until the instantaneous phase deviation between the feedback signal and the data signal exceeds said predetermined threshold value.

3. The digital phase locked loop circuit of claim 1 further including synchronous reversible counter means for measuring the instantaneous deviation between the feedback signal and the data input signal.

4. The digital phase locked loop circuit of claim 1 wherein a gated feedback shift register is utilized as said reversible counter means.

5. The digital phase locked loop circuit of claim 1 wherein said phase adjusting means includes means for identifying a data condition wherein a data input pulse occurs in advance of a feedback signal pulse whereupon the comparator means commences to count pulses until the arrival of said feedback signal pulse, whereupon it utilizes the accumulated count to effect a precisely determined advance of the following feedback signal pulse.

6. A digital phase locked loop circuit for synchronizing the phase and frequency of a digital feedback signal with a digital data input signal comprising
    synchronous reversible counter means,
    signal pulse generator means for producing a standard clock count,
    comparator means adapted to receive inputs representing the data input signal and the feedback signal for producing an output to the counter whereby the counter measures the instantaneous phase deviation between the leading edge of a pulse of a feedback signal and the leading edge of the pulse of the data input signal during a particular measuring sequence, and
    counter control means responsive to said comparator signal for adding to or deleting groups of pulses from said comparator output signal that are proportional to the instantaneous phase deviation measured by said counter means during said sequence and repeating the measuring sequence until synchronization is achieved.

7. The digital phase locked loop circuit of claim 6 wherein said counter control means includes threshold circuit means for preventing the addition or deletion of groups of pulses from said comparator output signal unless the instantaneous deviation between the feedback signal and the data input signal exceeds a predetermined adjustable threshold value.

* * * * *